United States Patent
Shibuya

(10) Patent No.: US 11,370,939 B2
(45) Date of Patent: Jun. 28, 2022

(54) POLISHING SLURRY, METHOD FOR POLISHING GLASS, AND METHOD FOR MANUFACTURING GLASS

(71) Applicant: AGC Inc., Tokyo (JP)

(72) Inventor: Tomohiro Shibuya, Tokyo (JP)

(73) Assignee: AGC INC., Tokyo (JP)

( * ) Notice: Subject to any disclaimer, the term of this patent is extended or adjusted under 35 U.S.C. 154(b) by 0 days.

(21) Appl. No.: 17/006,236

(22) Filed: Aug. 28, 2020

(65) Prior Publication Data

US 2021/0079265 A1 Mar. 18, 2021

Related U.S. Application Data

(63) Continuation of application No. PCT/JP2019/036422, filed on Sep. 17, 2019.

(51) Int. Cl.

| | |
|---|---|
| *C09G 1/04* | (2006.01) |
| *C03C 15/02* | (2006.01) |
| *C09G 1/14* | (2006.01) |
| *H01L 21/306* | (2006.01) |
| *C09K 3/14* | (2006.01) |
| *H01L 21/321* | (2006.01) |
| *C09G 1/00* | (2006.01) |
| *C09K 13/06* | (2006.01) |
| *C09G 1/06* | (2006.01) |
| *B82Y 30/00* | (2011.01) |

(52) U.S. Cl.
CPC ................ *C09G 1/04* (2013.01); *C03C 15/02* (2013.01); *C09G 1/00* (2013.01); *C09G 1/06* (2013.01); *C09G 1/14* (2013.01); *C09K 3/1454* (2013.01); *C09K 3/1463* (2013.01); *C09K 13/06* (2013.01); *H01L 21/30625* (2013.01); *H01L 21/3212* (2013.01); *B82Y 30/00* (2013.01)

(58) Field of Classification Search
None
See application file for complete search history.

(56) References Cited

U.S. PATENT DOCUMENTS

| | | |
|---|---|---|
| 5,607,718 A | 3/1997 | Sasaki et al. |
| 5,775,980 A | 7/1998 | Sasaki et al. |
| 2004/0035153 A1* | 2/2004 | Koike ................... B24B 37/044 430/5 |
| 2005/0176250 A1 | 8/2005 | Takahashi et al. |
| 2009/0239450 A1 | 9/2009 | Ishida et al. |

(Continued)

FOREIGN PATENT DOCUMENTS

| | | | |
|---|---|---|---|
| JP | H0786216 | * 3/1995 | ............... B24B 1/00 |
| JP | 2000-136374 A | 5/2000 | |

(Continued)

OTHER PUBLICATIONS

Japanese Patent Office, "Notice of Reasons for Refusal," issued in connection with Japanese Patent Application No. 2019-566854, dated Jan. 7, 2020.

(Continued)

*Primary Examiner* — Jiong-Ping Lu
(74) *Attorney, Agent, or Firm* — Foley & Lardner LLP

(57) ABSTRACT

Smoothness of glass is improved. A polishing slurry (A) contains amorphous carbon and water, and a total amount of the amorphous carbon and the water is equal to or more than 90% of the whole polishing slurry in terms of mass ratio.

7 Claims, 1 Drawing Sheet

(56) References Cited

U.S. PATENT DOCUMENTS

2015/0155181 A1    6/2015   Wang et al.
2016/0217818 A1    7/2016   Tawara
2019/0153279 A1    5/2019   Tawarazako et al.

FOREIGN PATENT DOCUMENTS

| | | |
|---|---|---|
| JP | 3172008 B2 | 6/2001 |
| JP | 2009-050920 A | 3/2009 |
| JP | 2010-016063 A | 1/2010 |
| JP | 2011-121151 A | 6/2011 |
| JP | 2016-216703 A | 12/2016 |
| JP | 2017-075316 A | 4/2017 |
| WO | WO-2007/030724 A2 | 3/2007 |
| WO | WO-2015/046542 A1 | 4/2015 |

OTHER PUBLICATIONS

International Searching Authority, "International Search Report," issued in connection with International Patent Application No. PCT/JP2019/036422, dated Oct. 1, 2019.

International Searching Authority, "Written Opinion," issued in connection with International Patent Application No. PCT/JP2019/036422, dated Oct. 1, 2019.

\* cited by examiner

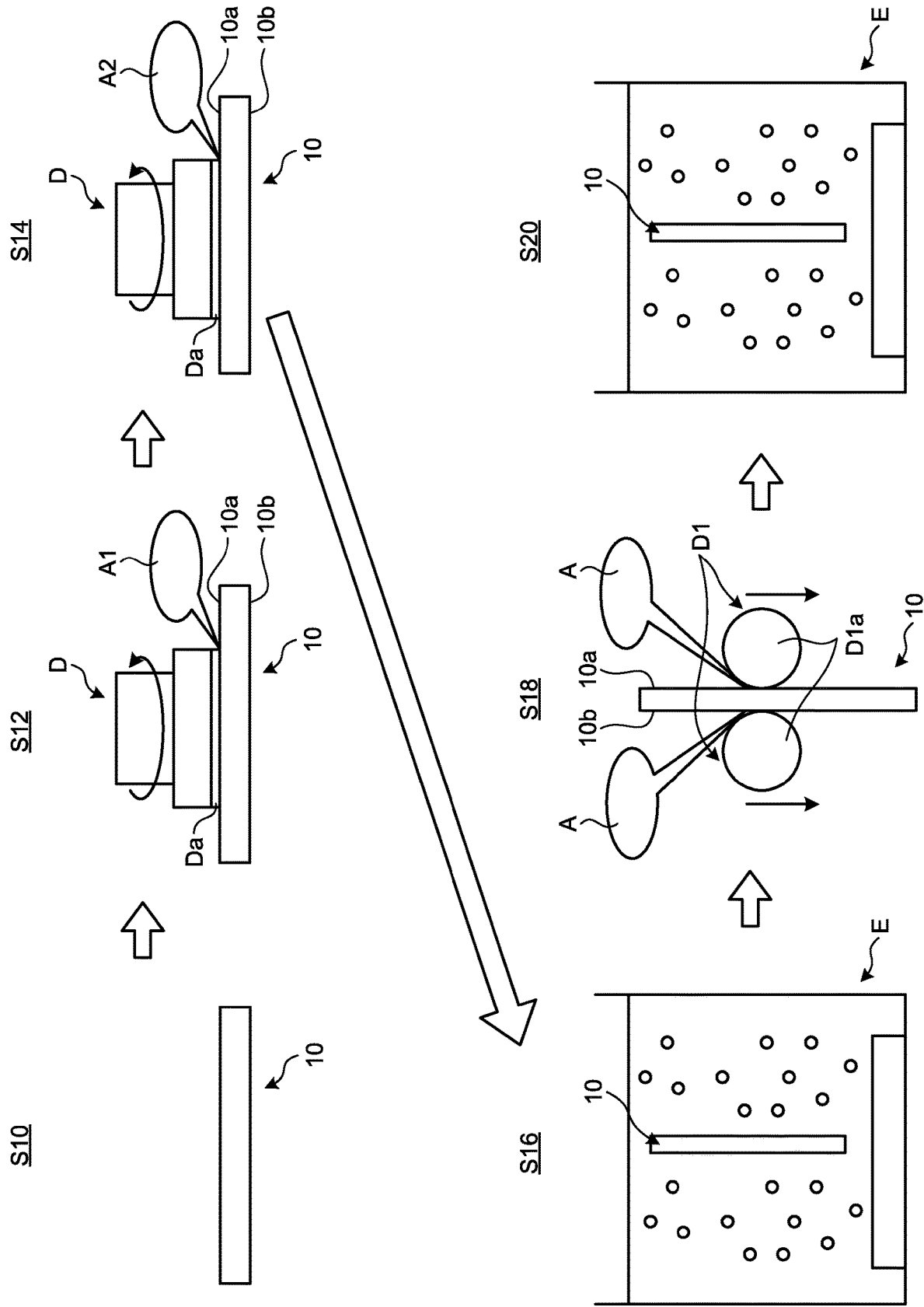

POLISHING SLURRY, METHOD FOR POLISHING GLASS, AND METHOD FOR MANUFACTURING GLASS

CROSS-REFERENCE TO RELATED APPLICATION(S)

This application is a continuation of International Application No. PCT/JP2019/036422, filed on Sep. 17, 2019, the entire contents of which are incorporated herein by reference.

FIELD

The present invention relates to a polishing slurry, a method for polishing glass, and a method for manufacturing glass.

BACKGROUND

As a polishing slurry for the surface of a glass plate, cerium oxide, colloidal silica, and the like are generally used. In recent years, the demand for improving the smoothness of a glass plate has been increasing, and in particular, in a case where the glass plate is used for an optical material such as an light guide plate, the smoothness is expected at a higher level. For example, in Patent Literature 1, fumed silica is used as a polishing slurry. In Patent Literature 2, resin is used as a polishing slurry. In Patent Literature 3, diamond is used as a polishing slurry.

CITATION LIST

Patent Literature

Patent Literature 1: Japanese Laid-open Patent Publication No. 2009-50920
Patent Literature 2: WO2015/046542
Patent Literature 3: Japanese Laid-open Patent Publication No. 2016-216703

SUMMARY

Technical Problem

However, there is still room for improvement in polishing slurrys used for improving the smoothness of glass. Consequently, it has been desired to provide a polishing slurry that can improve the smoothness of glass.

The present invention has been made in view of the above problem, and an object is to provide a polishing slurry that can improve the smoothness of glass, a method for polishing glass, and a method for manufacturing glass.

Solution to Problem

To solve the problem and achieve the object above, a polishing slurry of the present disclosure comprises: amorphous carbon and water, wherein a total amount of the amorphous carbon and the water is equal to or more than 90% of whole of the polishing slurry in terms of mass ratio.

To solve the problem and achieve the object above, a method for polishing glass of the present disclosure is polishing glass using the polishing slurry.

To solve the problem and achieve the object above, a method for manufacturing glass is manufacturing glass using the method for polishing glass.

Advantageous Effects of Invention

With the present invention, it is possible to improve the smoothness of glass.

BRIEF DESCRIPTION OF DRAWINGS

The FIGURE is a schematic diagram for explaining a method for manufacturing glass according to the present embodiment.

DESCRIPTION OF EMBODIMENTS

Hereinafter, a preferred embodiment of the present invention will be described in detail with reference to the accompanying drawing. However, the present invention is not limited to the embodiment. When there are a plurality of embodiments, the embodiments may be combined with one another. Moreover, numerical range includes a rounded-of range.

A polishing slurry A according to the present embodiment is a polishing slurry used for polishing glass 10. The polishing slurry A contains water and amorphous carbon. In this example, the water is preferably pure water. The amorphous carbon is non-crystalline carbon that does not have a crystalline structure, and is carbon that does not have a planar crystalline structure such as a graphite structure, or carbon that does not have a crystalline structure such as diamond. For example, an oil furnace method may be used to manufacture amorphous carbon. For example, in the oil furnace method, amorphous carbon is manufactured by spraying raw material oil into high temperature atmosphere of 1300 degrees or more, thermally decomposing the raw material oil, and quickly cooling the oil. However, the method for manufacturing amorphous carbon is not limited thereto, and any desired manufacturing method may be used.

An X-ray diffraction method may be used to identify amorphous carbon. For example, if the peak waveform of carbon serving as an object to be analyzed obtained as a result of X-ray diffraction analysis differs from the peak waveform of a known graphite structure or the peak waveform of a known diamond structure, the object to be analyzed can be determined as amorphous carbon. The peak waveform of the graphite structure may be obtained from data in the inorganic crystal structure database (ICSD) No. 53780 and No. 53781, and the peak waveform of the diamond structure may be obtained from data in the ICSD No. 53779.

Moreover, in the present application, amorphous may be referred to as a primary structure because amorphous does not have a crystalline structure, graphite may be referred to as a secondary structure because graphite has a two-dimensional crystalline structure, and one that has a three-dimensional crystalline structure may be referred to as a tertiary structure.

The average primary particle diameter of the amorphous carbon serving as abrasive particles contained in the polishing slurry A is preferably within a range from 20 nm to 500 nm, and more preferably within a range from 20 nm to 150 nm. The primary particle diameter is a particle diameter of a single particle, and the average primary particle diameter is an average value of the primary particle diameter. Moreover, in this example, from 20 nm to 500 nm refers to equal to or more than 20 nm and equal to or less than 500 nm, and the same applies hereinafter. By setting the average primary particle diameter to a value equal to or more than 20 nm, it is possible to reduce the surface roughness of the glass 10.

Moreover, by setting the average primary particle diameter to a value equal to or less than 500 nm, it is possible to prevent scratches from being formed on the surface of the glass 10. Furthermore, by setting the average primary particle diameter to a value equal to or less than 150 nm, it is possible to more suitably prevent scratches from being formed on the surface of the glass 10.

It is to be noted that any method may be used to measure the average primary particle diameter of amorphous carbon in the present embodiment. For example, the Brunauer-Emmett-Teller (BET) diameter may be calculated from the specific surface area ($m^2/g$) measured by a BET method and density of carbon (for example, 7.215 $g/cm^3$) under the assumption that the particle has a spherical shape and that pores are not formed in the abrasive particles. Then, the average primary particle diameter may be calculated from the BET diameter.

In the present embodiment, a hydrophilic treatment may be performed on hydrophobic amorphous carbon contained in the polishing slurry A. In general, amorphous carbon is hydrophobic, and has low dispersibility in water. The hydrophilic amorphous carbon has excellent dispersibility in pure water. Thus, compared with the hydrophobic amorphous carbon the surface of which is not treated with the hydrophilic treatment, hydrophilic amorphous carbon is preferable because the hydrophilic amorphous carbon can be suitably used at a lower concentration. The method of hydrophilic treatment is not limited. For example, a hydrophilic group may be formed on the surface of amorphous carbon using a known method such as surface modification using a plasma treatment, an ultraviolet (UV) treatment, and a surfactant. In other words, hydrophilic amorphous carbon is amorphous carbon containing a hydroxyl group on the surface thereof, thereby having a high affinity for water. In general, the hydrophilic group includes a hydroxyl group, but may also include a carboxyl group, an amino group, ethylene oxide, and the like.

In the present embodiment, the total content of amorphous carbon and water in the polishing slurry A is preferably equal to or more than 90% with respect to the whole polishing slurry A in terms of mass ratio. In other words, the total content of amorphous carbon and water in the polishing slurry A is preferably from 90% to 100%. Moreover, in the present embodiment, the content of amorphous carbon in the polishing slurry A is preferably from 0.0001% to 20% with respect to the whole polishing slurry A in terms of mass ratio, and more preferably from 0.0005% to 1%. Because the total content of amorphous carbon and water is equal to or more than 90%, it is possible to appropriately polish the glass 10. Moreover, because the content of amorphous carbon is equal to or more than 0.0001%, it is possible to appropriately polish the glass 10, and because the content of amorphous carbon is equal to or less than 20%, it is possible to prevent scratches from being formed on the surface of the glass 10. Furthermore, because the content of amorphous carbon is equal to or more than 0.0005%, it is possible to more appropriately polish the glass 10, and because the content of amorphous carbon is equal to or less than 1%, it is possible to more suitably prevent scratches from being formed on the surface of the glass 10.

[Other Components]

Moreover, in addition to amorphous carbon and water, as the other components, the polishing slurry A may also contain known additives such as a PH adjusting agent including acid, alkali, and the like; and a dispersing agent, up to 10% with respect to the whole polishing slurry A in terms of mass ratio. The dispersing agent may be polymer containing a carboxyl group, a sulfone group, a hydroxyl group, and the like at the end; nonionic surfactants; anionic surfactants; cationic surfactants; and the like. For example, by adding the dispersing agent to the polishing slurry A, it is possible to appropriately disperse hydrophobic amorphous carbon in water, and uniformly polish the surface of the glass 10. For example, the content of the dispersing agent in the polishing slurry A is preferably from 0.001% to 10% with respect to the whole polishing slurry A in terms of mass ratio. Because the content of the dispersing agent is equal to or more than 0.001%, it is possible to appropriately disperse amorphous carbon in water. Because the content of the dispersing agent is equal to or less than 10%, it is possible to prevent excessive consumption of the dispersing agent.

In the present embodiment, the glass 10 is manufactured by polishing the glass 10 using the polishing slurry A as described above. The polishing slurry A can polish glass of any composition. For example, the glass 10 polished by the polishing slurry A may be soda lime glass, borosilicate glass, crystallized glass, quartz glass, and the like. In the present embodiment, the glass 10 is a sheet-shaped glass plate, and may be flat or curved. The shape of the glass 10 may be optional.

Hereinafter, a method for manufacturing the glass 10 according to the present embodiment will be described. The FIGURE is a schematic diagram for explaining a method for manufacturing glass according to the present embodiment. As illustrated in the FIGURE, in the manufacturing method according to the present embodiment, the glass 10 before being polished is first prepared (step S10). For example, the glass 10 before being polished is prepared by cutting out glass, which is manufactured by any method such as a melt casting method, into a predetermined size, and by thinning (lapping) the cut glass. For example, the method of thinning glass includes a method of dry polishing the cut glass using a grindstone and the like. However, the method for preparing the glass 10 before being polished is not limited to the above and any method may be used.

After preparing the glass 10 before being polished, a cerium oxide polishing step is performed on the glass 10 before being polished (step S12). At the cerium oxide polishing step, the glass 10 is polished using a cerium oxide polishing slurry A1 serving as a polishing slurry. The cerium oxide polishing slurry A1 is a polishing slurry containing cerium oxide serving as abrasive particles, and water. At the cerium oxide polishing step, the glass 10 is polished using a polishing machine D that has a polishing pad Da on the surface. At the cerium oxide polishing step, the surface of the glass 10 is polished by rotating the polishing pad Da, while the polishing pad Da is pressed against the surface of the glass 10, and while the liquid cerium oxide polishing slurry A1 is supplied on the surface of the glass 10. For example, by polishing the surface of the glass 10 using the cerium oxide polishing slurry A1, surface roughness Ra (arithmetic mean roughness) of the surface of the polished glass 10 is set within a range from 0.2 nm to 0.6 nm. At the cerium oxide polishing step, at least one of a surface 10a of the glass 10 and a surface 10b at a side opposite to the surface 10a will be polished. Moreover, the glass 10 may also be washed using a method similar to that at step S16, which will be described below, after the cerium oxide polishing step is executed. Moreover, at the cerium oxide polishing step, the glass 10 may be polished by any method, as long as the cerium oxide polishing slurry A1 is used, the method being not limited to polishing the glass 10 using the polishing machine D having the structure illustrated in the FIGURE.

After polishing the glass 10 using the cerium oxide polishing slurry A1, a silica polishing step is performed on the glass 10 that has been polished using the cerium oxide polishing slurry A1 (step S14). At the silica polishing step, the glass 10 is polished using a silica polishing slurry A2 serving as a polishing slurry. The silica polishing slurry A2 is a polishing slurry containing silica serving as abrasive particles, and water. The silica may be colloidal silica. At the silica polishing step, the glass 10 is polished using the polishing machine D. At the silica polishing step, the surface of the glass 10 is polished, by rotating the polishing pad Da while the polishing pad Da is pressed against the surface of the glass 10, and while the liquid silica polishing slurry A2 is supplied on the surface of the glass 10. For example, by polishing the surface of the glass 10 using the silica polishing slurry A2, the surface roughness Ra of the surface of the polished glass 10 is set within a range from 0.1 nm to 0.3 nm. At the silica polishing step, at least one of the surface 10a and the surface 10b of the glass 10 is polished. Moreover, at the silica polishing step, the glass 10 may be polished using any method, as long as the silica polishing slurry A2 is used, the method being not limited to polishing the glass 10 using the polishing machine D.

After polishing the glass 10 using the silica polishing slurry A2, the glass 10 is washed (step S16). At step S16, the glass 10 that has been polished using the silica polishing slurry A2 is washed by placing the glass 10 in a washing container E. For example, the washing container E is filled with liquid such as water, and the liquid is aerated by an aeration device. The glass 10 is washed by being immersed in the liquid in the washing container E, and by being aerated by the aeration device. However, the method for washing the glass 10 is not limited thereto, and any method may be used. Moreover, washing the glass 10 is not necessarily required.

After washing the glass 10, a polishing step is performed on the washed glass 10 (step S18). At the polishing step, the glass 10 is polished using the polishing slurry A. However, a dummy polishing step may also be performed in advance under the same condition as that of the polishing step. At the polishing step, the glass 10 is polished using a polishing machine D1. For example, the polishing machine D1 includes a cylinder-shaped polishing pad D1a. The polishing machine D1 polishes the surface of the glass 10, by pressing the side surface of the polishing pad D1a against the surface of the glass 10, and relatively moving the polishing pad D1a against the glass 10 in a direction along the surface of the glass 10. At the polishing step, the surface of the glass 10 is polished, by relatively moving the polishing pad D1a while the polishing pad D1a is pressed against the surface of the glass 10, and while the liquid polishing slurry A is supplied on the surface of the glass 10. By polishing the surface of the glass 10 using the polishing slurry A, for example, the surface roughness Ra of the surface of the polished glass 10 is set within a range from 0.03 nm to 0.05 nm. At the polishing step, at least one of the surface 10a and the surface 10b of the glass 10 is polished. At the polishing step, the method of polishing the glass is not limited to a method using the cylinder-shaped polishing pad D1a, but the glass 10 may be polished using the polishing machine D, for example. In other words, at the polishing step, the glass 10 may be polished by any method as long as the polishing slurry A is used.

At the polishing step, the supplying amount of the polishing slurry A on the surface of the glass 10 per unit time is preferably from 1 mL/min to 30 mL/min. By setting the supplying amount of the polishing slurry A to a value equal to or more than 1 mL/min, a sufficient amount of the abrasive particles is supplied to the polishing pad D1a, and the surface smoothness will be improved. By setting the supplying amount of the polishing slurry A to a value equal to or less than 30 mL/min, it is possible to prevent excessive consumption of the abrasive particles. Moreover, at the polishing step, the pressing force, which is pressure to press the polishing pad against the surface of the glass 10, is preferably from 40 $g/cm^2$ to 200 $g/cm^2$. By setting the pressing force to a value equal to or more than 40 $g/cm^2$, it is possible to appropriately polish the glass 10, and by setting the pressing force to a value equal to or less than 200 $g/cm^2$, it is possible to prevent scratches from being formed on the surface of the glass 10. The pressing force of the polishing pad at the polishing step may be set smaller than the pressing force of the polishing pad at the cerium oxide polishing step and the silica polishing step. Moreover, at the polishing step, the polishing time by the polishing pad is preferably equal to or more than a minute and equal to or less than ten minutes. By setting the polishing time to a value equal to or more than one minute, it is possible to appropriately polish the glass 10, and by setting the polishing time to a value equal to or less than ten minutes, it is possible to prevent scratches from being formed on the surface of the glass 10. The polishing time at the polishing step may be set shorter than the polishing time at the cerium oxide polishing step and the silica polishing step.

After polishing the glass 10 using the polishing slurry A, the glass 10 is washed (step S20). At step S20, the glass 10 is washed using the method similar to the method at step S16, by placing the glass 10 for which the polishing slurry A has been used in the washing container E. However, any method may also be used for washing the glass 10 at step S20, and step S20 is not necessarily required.

As described above, in the present embodiment, the glass 10 is polished using the cerium oxide polishing slurry A1, the glass 10 that has been polished by the cerium oxide polishing slurry A1 is polished using the silica polishing slurry A2, and the glass 10 that has been polished by the silica polishing slurry A2 is polished using the polishing slurry A. By polishing the glass 10 in this manner, it is possible to manufacture the glass 10 the surface roughness of which is small and that has high smoothness. However, the polishing process of the glass 10 is not limited thereto, and the glass 10 does not have to be polished by the silica polishing slurry A2 (step S14), for example. In this case, the glass 10 is polished by the cerium oxide polishing slurry A1, and the glass 10 that has been polished by the cerium oxide polishing slurry A1 is polished by the polishing slurry A. Moreover, the glass 10 does not have to be polished by the cerium oxide polishing slurry A1, and in the present embodiment, the glass 10 may be polished at least by the polishing slurry A.

As described above, the polishing slurry A according to the present embodiment contains amorphous carbon and water, and the total amount of amorphous carbon and water is equal to or more than 90% of the whole polishing slurry A in terms of mass ratio. By using the amorphous carbon as the polishing slurry A, it is possible to reduce the surface roughness of the glass 10, and improve the smoothness of the glass 10.

Moreover, in the polishing slurry A, the average primary particle diameter of amorphous carbon is preferably within a range from 20 nm to 500 nm. By setting the average primary particle diameter to a value equal to or more than 20 nm, it is possible to reduce the surface roughness of the glass 10. By setting the average primary particle diameter to a value equal to or less than 500 nm, it is possible to prevent scratches from being formed on the surface of the glass 10. In this manner, by using the amorphous carbon as a polishing slurry, it is possible to reduce the surface roughness of the glass 10 and improve the smoothness of the glass 10, while reducing the particle diameter to prevent scratches from being formed on the glass 10.

Furthermore, in the polishing slurry A, the content of amorphous carbon with respect to the whole polishing slurry A is preferably within a range from 0.0001% to 20% in terms of mass ratio. By setting the content of amorphous carbon to a value equal to or more than 0.5%, it is possible to appropriately polish the glass 10, and by setting the content of amorphous carbon to a value equal to or less than 20%, it is possible to appropriately prevent scratches from being formed on the surface of the glass 10.

Still furthermore, it is preferable that the polishing slurry A contains a dispersing agent. By adding the dispersing agent to the polishing slurry A, it is possible to appropriately disperse amorphous carbon in water, and uniformly polish the surface of the glass 10.

Still furthermore, it is preferable that the amorphous carbon in the polishing slurry A is hydrophilic. By using the hydrophilic amorphous carbon, it is possible to suitably use the amorphous carbon even at a low concentration.

Still furthermore, the polishing slurry A is used for polishing glass. By polishing the glass 10 using the polishing slurry A, it is possible to improve the smoothness of the glass 10.

Still furthermore, in the method for polishing the glass 10 according to the present embodiment, the glass 10 is polished using the polishing slurry A. By polishing the glass 10 using the polishing slurry A, it is possible to improve the smoothness of the glass 10.

Still furthermore, the method for polishing the glass 10 according to the present embodiment includes the cerium oxide polishing step and the polishing step performed after the cerium oxide polishing step. At the cerium oxide polishing step, the glass 10 is polished using the cerium oxide polishing slurry A1 containing cerium oxide. At the polishing step, the glass 10 is polished using the polishing slurry A after the cerium oxide polishing step. In the present polishing method, by polishing the glass 10 using the polishing slurry A after polishing the glass 10 using the cerium oxide polishing slurry A1, it is possible to reduce the surface roughness Ra of the glass 10, and improve the smoothness of the glass 10.

Still furthermore, the method for polishing the glass 10 according to the present embodiment further includes the silica polishing step in which the glass 10 is polished using the silica polishing slurry A2 containing silica after the cerium oxide polishing step. At the polishing step, the glass 10 is polished using the polishing slurry A after the silica polishing step. In the present polishing method, the glass 10 subjected to polishing using the cerium oxide polishing slurry A1 and the silica polishing slurry A is polished using the polishing slurry A, so that it is possible to reduce the surface roughness Ra of the glass 10 and more suitably improve the smoothness of the glass 10.

Still furthermore, in the method for manufacturing the glass 10 according to the present embodiment, the glass 10 is manufactured using the method for polishing the glass 10 according to the present embodiment. In the present manufacturing method, manufacturing the glass 10 by polishing the glass 10 using the polishing slurry A can improve the smoothness of the glass 10. In particular, the glass 10 polished using the polishing slurry A has high smoothness, so that it is possible to suitably use the glass 10 as an optical element such as a light guide plate.

Examples

Next, Examples will be described. The embodiment may be modified as long as the effect of the invention is exhibited. In Examples and Comparative Examples, different polishing slurrys were prepared. Glass was polished using the polishing slurrys, the surface roughness Ra of the polished glass was measured, and the polishing slurrys were evaluated on the basis of the measurement results of the surface roughness Ra. Hereinafter, description will be given in more detail.

[Evaluation Glass]

The length of the first side of the glass prepared in Examples and Comparative Examples was 50 mm, the length of the second side of the glass that intersects with the first side was 50 mm, and the thickness of the glass was 1.0 mm. The prepared pieces of glass were alkali-free borosilicate glass, more specifically, AN100 manufactured by AGC Inc., and aluminosilicate glass, more specifically, Rollandα' manufactured by AGC Inc. In Example 5, Rollandα' was used.

[Cerium Oxide Polished Glass]

In Examples and Comparative Examples, the prepared glass was polished using the cerium oxide polishing slurry A1 under the following conditions. Specifically, as the polishing machine, FAM12BS manufactured by SpeedFam Co., Ltd. was used, and as the cerium oxide polishing slurry A1, a polishing slurry that contains 95 weight percent of water and 5 weight percent of cerium oxide abrasive particles manufactured by Showa Denko was used. Moreover, as the polishing pad, the suede-type pad AG8 manufactured by FILWEL Co., Ltd. was used, the rotation speed of the polishing plate was set to 40 rpm, the pressing force of the polishing pad was set to 144 $g/cm^2$, the polishing time was set to 30 minutes, and the supplying amount of the cerium oxide polishing slurry A1 was set to 5 ml/min. Hereinafter, the glass polished using the cerium oxide polishing slurry A1 under these conditions is referred to as cerium oxide polished glass, as appropriate. The surface roughness Ra of the cerium oxide polished glass was 0.55 nm.

[Silica Polished Glass]

Moreover, in Examples and Comparative Examples, the prepared glass was polished using the silica polishing slurry A2 under the following conditions. Specifically, as the polishing machine, FAM12BS manufactured by SpeedFam Co., Ltd. was used, and as the silica polishing slurry A2, a polishing slurry that contains 93 weight percent of water, and 7 weight percent of colloidal silica abrasive particles manufactured by Fujimi Incorporated was used. Moreover, as the polishing pad, the suede-type pad NP787 manufactured by FILWEL Co., Ltd. was used, the rotation speed of the polishing plate was set to 40 rpm, the pressing force of the polishing pad was set to 100 $g/cm^2$, the polishing time was set to 20 minutes, and the supplying amount of the silica polishing slurry A2 was set to 5 ml/min. Hereinafter, the glass polished using the silica polishing slurry A2 under these conditions is referred to as silica polished glass, as appropriate. The surface roughness Ra of the silica polished glass was 0.15 nm.

[Polishing Conditions]

The cerium oxide polished glass and the silica polished glass were polished using a polishing slurry in the composition disclosed in Examples and Comparative Examples illustrated in the following Table 1.

More specifically, the content of the abrasive particles such as amorphous carbon with respect to the whole polishing slurry, in other words, the concentration of the abrasive particles was set to 1% or 0.01%, in terms of mass ratio. When the concentration of the abrasive particles was set to 1%, 1 g of the abrasive particles listed in Table 1 and Table 2 were mixed with 99 g of water, stirred until the abrasive particles were uniformly dispersed in water, and the result was used as the polishing slurry. When the concentration of the abrasive particles was set to 0.01%, 0.01 g of the abrasive particles listed in Table 1 and Table 2 were mixed with 99.9 g of water, stirred until the abrasive particles were uniformly dispersed in water, and the result was used as the polishing slurry. By using the polishing slurry, the cerium oxide polished glass and the silica polished glass were polished under the following conditions. As the polishing machine, FAM12BS manufactured by SpeedFam Co., Ltd. was used, as the polishing pad, the suede-type pad NP787 manufactured by FILWEL Co., Ltd. was used, the rotation speed of the polishing plate was set to 40 rpm, the pressing force of the polishing pad was set to 44 g/cm$^2$, the polishing time was set to 1 minute, and the supplying amount of the polishing slurry was set to 5 ml/min.

As the amorphous carbon serving as the abrasive particles in Example 1, Asahi #35 manufactured by Asahi Carbon Co., Ltd. was used. As the amorphous carbon serving as the abrasive particles in Example 2, Asahi #60HN manufactured by Asahi Carbon Co., Ltd. was used. As the amorphous carbon serving as the abrasive particles in Example 3 and Example 6, Tokai carbon #7550F manufactured by Tokai Carbon Co., Ltd. was used. As the amorphous carbon serving as the abrasive particles in Examples 4 and 5 and Example 7, Aqua Black-001 manufactured by Tokai Carbon Co., Ltd. was used.

The amorphous carbon from Examples 1 to 3, and Example 6 is hydrophobic, and the amorphous carbon in Examples 4 and 5 and Example 7 is hydrophilic.

The silica serving as the abrasive particles in Comparative Example 1 was in an amorphous state, and AEROSIL 200 manufactured by Nippon Aerosil Co., Ltd. was used. The titania serving as the abrasive particles in Comparative Example 2 had a rutile and anatase structure, and AEROSIL TiO2 P25 manufactured by Nippon Aerosil Co., Ltd. was used. The alumina serving as the abrasive particles in Comparative Example 3 had an α and γ Al$_2$O$_3$ structure, and AEROXIDE Alu C manufactured by Nippon Aerosil Co., Ltd. was used. The resin serving as the abrasive particles in Comparative Example 4 was in an amorphous state, and Epostar MA1004 manufactured by Nippon Shokubai Co., Ltd. was used. The resin serving as the abrasive particles in Comparative Example 5 was in an amorphous state, and TOSPEARL130 manufactured by Momentive Performance Materials Japan was used.

The carbon serving as the abrasive particles in Comparative Example 6 had a graphite structure, and JCPB manufactured by Nippon Carbon Co., Ltd. was used. The carbon serving as the abrasive particles in Comparative Example 7 had a graphite structure, and the one obtained by milling, the JCPB manufactured by Nippon Carbon Co., Ltd. was used. More specifically, 5 g of JCPB and 100 g of pure water were put into a container, and 300 g (about 80 mL) of balls for bead mill the diameter of which is 0.5 mm was added. The mixture was milled for 80 minutes using a table-top ball mill under the condition of 200 rpm. Milled carbon was obtained by separating the balls and powder using a filter.

The carbon serving as the abrasive particles in Comparative Example 8 had a diamond structure, and μDiamond Andante manufactured by Ar Brown Co., Ltd. was used.

Moreover, the concentration of the abrasive particles in Example 6 and Example 7 was set to 0.01%, and the concentration of the abrasive particles in the other Examples and Comparative Examples was set to 1%.

TABLE 1

| | Conditions | | | Evaluation Results | | | |
|---|---|---|---|---|---|---|---|
| | Polishing slurry | | | Cerium Oxide Polished Glass | | Silica Polished Glass | |
| | Type | Average Primary Particle Size (nm) | Glass | Surface Roughness Ra | Evaluation | Surface Roughness Ra | Evaluation |
| Example 1 | Amorphous Carbon (Primary Structure) | 139 | Alkali-Free Borosilicate Glass | 0.14 | ◎ | 0.04 | ◎ |
| Example 2 | Amorphous Carbon (Primary Structure) | 68 | Alkali-Free Borosilicate Glass | 0.15 | ◎ | 0.04 | ◎ |
| Example 3 | Amorphous Carbon (Primary Structure) | 28 | Alkali-Free Borosilicate Glass | 0.15 | ◎ | 0.04 | ◎ |
| Example 4 | Amorphous Carbon (Primary Structure) | 23 | Alkali-Free Borosilicate Glass | 0.16 | ◎ | 0.04 | ◎ |
| Example 5 | Amorphous Carbon (Primary Structure) | 23 | Aluminosilicate Glass | 0.13 | ◎ | 0.03 | ◎ |
| Comparative Example 1 | Silica (Primary | 13 | Alkali-Free Borosilicate Glass | 0.43 | X | 0.10 | X |

TABLE 1-continued

| | Conditions | | | Evaluation Results | | | |
| --- | --- | --- | --- | --- | --- | --- | --- |
| | Polishing slurry | | | Cerium Oxide Polished Glass | | Silica Polished Glass | |
| | Type | Average Primary Particle Size (nm) | Glass | Surface Roughness Ra | Evaluation | Surface Roughness Ra | Evaluation |
| Comparative Example 2 | Titania (Tertiary Structure) | 33 | Alkali-Free Borosilicate Glass | 0.52 | X | 0.08 | Δ |
| Comparative Example 3 | Alumina (Tertiary Structure) | 17 | Alkali-Free Borosilicate Glass | 3.79 | X | 0.07 | Δ |
| Comparative Example 4 | Resin (Primary Structure) | 4005 | Alkali-Free Borosilicate Glass | 0.35 | Δ | 0.06 | ○ |
| Comparative Example 5 | Resin (Primary Structure) | 185 | Alkali-Free Borosilicate Glass | 0.34 | Δ | 0.06 | ○ |
| Comparative Example 6 | Carbon (Secondary Structure) | 292 | Alkali-Free Borosilicate Glass | 0.50 | X | 0.1 | X |
| Comparative Example 7 | Carbon (Secondary Structure) | 137 | Alkali-Free Borosilicate Glass | 0.55 | X | 0.1 | X |
| Comparative Example 8 | Carbon (Tertiary Structure) | 5 | Alkali-Free Borosilicate Glass | 0.35 | Δ | 0.05 | ◎ |

TABLE 2

| | Conditions | | | | | Evaluation Results | | | |
| --- | --- | --- | --- | --- | --- | --- | --- | --- | --- |
| | Polishing slurry | | | | | Ceria Polished | | Silica Polished | |
| | Type | Hydrophobic/ Hydrophilic | Average Primary Particle Size (nm) | Concentration of Abrasive particles (wt %) | Glass | Surface Roughness Ra | Evaluation | Surface Roughness Ra | Evaluation |
| Example 3 | Amorphous Carbon (Primary Structure) | Hydrophobic | 28 | 1 | Alkali-Free Borosilicate Glass | 0.15 | ◎ | 0.04 | ◎ |
| Example 6 | Amorphous Carbon (Primary Structure) | Hydrophobic | 28 | 0.01 | Alkali-Free Borosilicate Glass | 0.22 | ○ | 0.06 | ○ |
| Example 4 | Amorphous Carbon (Primary Structure) | Hydrophilic | 23 | 1 | Alkali-Free Borosilicate Glass | 0.16 | ◎ | 0.04 | ◎ |
| Example 7 | Amorphous Carbon (Primary Structure) | Hydrophilic | 23 | 0.01 | Alkali-Free Borosilicate Glass | 0.18 | ◎ | 0.04 | ◎ |

[Evaluation Conditions]

The surface roughness Ra (arithmetic surface roughness) of the cerium oxide polished glass and the silica polished glass that were polished using the polishing slurrys in this manner was measured using CypherS AFM of Asylum Research Corporation.

For the cerium oxide polished glass, a double circle was given when the surface roughness Ra was equal to or less than 0.20 nm, a circle was given when the surface roughness Ra was greater than 0.20 nm and equal to or less than 0.30 nm, a triangle was given when the surface roughness Ra was greater than 0.30 nm and equal to or less than 0.40 nm, and a cross was given when the surface roughness Ra was greater than 0.40 nm.

Moreover, for the silica polished glass, a double circle was given when the surface roughness Ra was equal to or less than 0.05 nm, a circle was given when the surface roughness Ra was greater than 0.05 nm and smaller than 0.07 nm, a triangle was given when the surface roughness Ra was equal to or more than 0.07 nm and smaller than 0.10 nm, and a cross was given when the surface roughness Ra was equal to or more than 0.10 nm.

In any case, the evaluation was performed by treating double circle and circle are accepted.

As listed in Table 1, in Examples, the evaluation results of the cerium oxide polished glass and the silica polished glass were accepted.

By contrast, in Comparative Examples, at least one of the evaluation results of the cerium oxide polished glass and the silica polished glass was not accepted. It can be known that, by using the amorphous carbon as the polishing slurry, it is possible to reduce the surface roughness of the glass and improve the smoothness of the glass. Moreover, as illustrated in Example 5, by using the amorphous carbon as the polishing slurry, it is possible to improve the smoothness of the glass with the type of glass being changed. Furthermore, as listed in Table 2, the comparison between Example 3 and Example 6 and the comparison between Example 4 and Example 7 show that the abrasive particles of hydrophilic amorphous carbon can maintain the surface roughness Ra more favorably than the abrasive particles of hydrophobic amorphous carbon can, even when the abrasive particles have a lower concentration.

In this manner, the embodiment of the present invention has been described. However, embodiment is not limited by the content of this embodiment. Moreover, the components described above include components that can be easily thought of by a person skilled in the art, components that are substantially the same, and components that fall within what is called range of equivalents. Moreover, the components described above can be combined with each other, as appropriate. Furthermore, various omissions, replacements, or modifications can be made to the components without departing from the scope and spirit of the embodiment described above.

REFERENCE SIGNS LIST

10 glass
A polishing slurry
A1 cerium oxide polishing slurry
A2 silica polishing slurry

The invention claimed is:

1. A method for polishing glass comprising:
  (a) polishing the glass using a first polishing slurry comprising cerium oxide abrasives or silica abrasives; and
  (b) polishing the glass to a surface roughness of 0.03 nm to 0.05 nm using a second polishing slurry comprising amorphous carbon and water, wherein:
    a total amount of the amorphous carbon and the water in the second polishing slurry is equal to or more than 90% of the second polishing slurry in terms of mass ratio;
    the amorphous carbon has an average primary particle size 20 nm to 150 nm;
    the amorphous carbon is present in the second polishing slurry at a concentration of 0.01% to 1.0% in terms of mass ratio; and
    the amorphous carbon is hydrophilic.

2. The method for polishing glass according to claim 1, wherein the first polishing slurry comprises cerium oxide abrasives.

3. The method for polishing glass according to claim 1, wherein the first polishing slurry comprises silica abrasives.

4. A method for manufacturing glass comprising manufacturing glass using the method for polishing glass according to claim 1.

5. The method of claim 1, wherein the polishing (b) comprises polishing the glass to a surface roughness of 0.03 nm to 0.04 nm.

6. The method of claim 1, wherein the second polishing slurry further comprises a dispersing agent.

7. The method of claim 1, wherein the second polishing slurry consists of amorphous carbon and water.

\* \* \* \* \*